US009337448B2

(12) United States Patent
Lee et al.

(10) Patent No.: US 9,337,448 B2
(45) Date of Patent: May 10, 2016

(54) ORGANIC LIGHT EMITTING DISPLAY

(71) Applicant: Samsung Display Co., Ltd., Yongin, Gyeonggi-Do (KR)

(72) Inventors: Sung-Soo Lee, Suwon-si (KR); Se Il Kim, Hwaseong-si (KR); Eun Kyoung Nam, Suwon-si (KR); Sang Eok Jang, Seoul (KR)

(73) Assignee: Samsung Display Co., Ltd., Yongin (KR)

(*) Notice: Subject to any disclaimer, the term of this patent is extended or adjusted under 35 U.S.C. 154(b) by 0 days.

(21) Appl. No.: 13/960,712

(22) Filed: Aug. 6, 2013

(65) Prior Publication Data

US 2014/0077185 A1 Mar. 20, 2014

(30) Foreign Application Priority Data

Sep. 19, 2012 (KR) ........................ 10-2012-0104131

(51) Int. Cl.

*H01L 29/08* (2006.01)
*H01L 51/52* (2006.01)
*H01L 27/32* (2006.01)

(52) U.S. Cl.

CPC ........ *H01L 51/5275* (2013.01); *H01L 27/3206* (2013.01); *H01L 51/5265* (2013.01); *H01L 27/3213* (2013.01); *H01L 27/3218* (2013.01); *H01L 51/5218* (2013.01); *H01L 51/5234* (2013.01); *H01L 51/5253* (2013.01); *H01L 51/5262* (2013.01)

(58) Field of Classification Search

CPC ............ H01L 27/3206; H01L 51/5265; H01L 51/5234; H01L 51/5253; H01L 51/562; H01L 27/3213; H01L 51/5275; H01L 51/5218; H01L 51/5262; H01L 27/3218; H01L 27/1225; H01L 27/3244; H01L 27/124; G09G 3/3233; G02F 1/1368

USPC .......... 257/40, 59, 79, 88, E27.121, E33.062, 257/E31.347, E29.279, E33.053, 98, 102, 257/E33.072

See application file for complete search history.

(56) References Cited

U.S. PATENT DOCUMENTS

| | | | | |
|---|---|---|---|---|
| 7,173,372 | B2 | 2/2007 | Koo et al. | |
| 7,531,958 | B2 | 5/2009 | Nishikawa et al. | |
| 7,973,319 | B2 | 7/2011 | Kashiwabara et al. | |
| 7,999,457 | B2 * | 8/2011 | Yoon ................... | H01L 51/5215 313/503 |
| 8,102,111 | B2 * | 1/2012 | Maeda ................ | H01L 51/5206 313/503 |
| 8,237,360 | B2 * | 8/2012 | Kinoshita ........... | H01L 27/3213 257/40 |
| 2005/0077816 | A1 * | 4/2005 | Yamada .............. | H01L 51/5228 313/503 |

(Continued)

FOREIGN PATENT DOCUMENTS

| | | |
|---|---|---|
| KR | 10-2005-0028803 A | 3/2005 |
| KR | 10-2005-0031922 A | 4/2005 |

(Continued)

*Primary Examiner* — Yosef Gebreyesus

(74) *Attorney, Agent, or Firm* — Knobbe Martens Olson & Bear LLP

(57) ABSTRACT

An organic light emitting display includes an array substrate, a plurality of light emitting devices disposed over the array substrate, and a plurality of color filters having different colors. The plurality of light emitting devices include a first light emitting device configured to emit light having a first color and a second light emitting device configured to emit light having a second color different from the first color, and the plurality of color filters include first and second color filters disposed over the first light emitting device and the second light emitting device, respectively.

7 Claims, 7 Drawing Sheets

(56) References Cited

U.S. PATENT DOCUMENTS

| | | | | |
|---|---|---|---|---|
| 2005/0225232 | A1* | 10/2005 | Boroson | H01L 51/5265 313/504 |
| 2006/0139254 | A1* | 6/2006 | Hayakawa et al. | 345/76 |
| 2006/0238120 | A1* | 10/2006 | Miller | C09K 11/06 313/506 |
| 2007/0001588 | A1* | 1/2007 | Boroson | H01L 27/3209 313/504 |
| 2007/0015429 | A1* | 1/2007 | Maeda | H01L 51/5265 445/24 |
| 2007/0090837 | A1 | 4/2007 | Van Der Kouwe et al. | |
| 2007/0102737 | A1* | 5/2007 | Kashiwabara | H01L 27/3211 257/291 |
| 2007/0176859 | A1* | 8/2007 | Cok | G09G 3/3225 345/76 |
| 2007/0205423 | A1 | 9/2007 | Yamazaki et al. | |
| 2007/0236135 | A1* | 10/2007 | Fukuda | H01L 27/3213 313/503 |
| 2009/0200544 | A1* | 8/2009 | Lee | H01L 51/5265 257/40 |
| 2009/0212696 | A1* | 8/2009 | Terao | H01L 51/5265 313/506 |
| 2010/0052524 | A1* | 3/2010 | Kinoshita | H01L 51/5265 313/504 |
| 2010/0252841 | A1* | 10/2010 | Cok et al. | 257/89 |
| 2011/0095276 | A1* | 4/2011 | Imai | H01L 27/322 257/40 |
| 2011/0114956 | A1* | 5/2011 | Park | H01L 51/5215 257/59 |
| 2012/0152347 | A1* | 6/2012 | Lee et al. | 136/256 |
| 2012/0286305 | A1* | 11/2012 | Sasaki et al. | 257/89 |

FOREIGN PATENT DOCUMENTS

| | | | |
|---|---|---|---|
| KR | 10-2007-0090837 | A | 9/2007 |
| KR | 10-2012-0041459 | A | 5/2012 |
| WO | 2005/039248 | A1 | 4/2005 |

* cited by examiner

ORGANIC LIGHT EMITTING DISPLAY

CROSS-REFERENCE TO RELATED APPLICATION

This U.S. non-provisional patent application claims priority under 35 U.S.C. §119 of Korean Patent Application No. 10-2012-0104131, filed on Sep. 19, 2012, the content of which is herein incorporated by reference in its entirety.

BACKGROUND

1. Field of Disclosure

The present disclosure relates to an organic light emitting display. More particularly, the present disclosure relates to an organic light emitting display capable of realizing a full-color image.

2. Description of the Related Technology

In an organic light emitting display, a hole and an electron are injected into an organic light emitting layer through an anode and a cathode and are recombined in the organic light emitting layer to generate an exciton. The exciton emits energy discharged when an excited state returns to a ground state as light.

To display a full-color image, in recent years, an organic light emitting display has been researched. For instance, the organic light emitting display includes a white organic light emitting device and a color filter to display the full-color image. However, when the organic light emitting display includes the color filter, brightness in each color becomes different by the color filter. In addition, a manufacturing cost of the organic light emitting display is increased due to the color filter.

SUMMARY

The present disclosure provides an organic light emitting display capable of displaying a full-color image without employing a color filter.

Embodiments of the inventive concept provide an organic light emitting display including an array substrate, a plurality of light emitting devices disposed over the array substrate, and a plurality of color filters disposed over the plurality of light emitting device and having different colors from each other. The plurality of light emitting devices includes a first light emitting device and a second light emitting device that are configured to emit light having a first color and a third light emitting device that is configured to emit light having a second color different from the first color, wherein the plurality of color filters comprise first and second filters disposed over the first light emitting device and the second light emitting device, respectively.

The first color is in a complementary relation to the second color.

Each of the first, second, and third light emitting devices includes a first electrode disposed over the array substrate, a second electrode opposing the first electrode, and an organic light emitting layer interposed between the first electrode and the second electrode, wherein each of the first and second light emitting devices further includes a third electrode interposed between the first electrode and the organic light emitting layer.

The first electrode includes first and second conductive layers that include a transparent conductive oxide material and a third conductive layer disposed between the first conductive layer and the second conductive layer and including a reflective material. The third conductive layer includes at least one selected from the group consisting of Mo, MoW, Cr, APC (Ag—Pd—Cu alloy), Al, and Al alloy.

The third electrode includes a transparent conductive oxide material.

The organic light emitting display further includes an encapsulating layer disposed over the second electrode.

The plurality of organic light emitting devices further includes a fourth light emitting device configured to emit light having a third color different from the first color and the second color. The fourth light emitting device includes a first electrode disposed over the array substrate, an organic light emitting layer disposed over the first electrode, a third electrode interposed between the first electrode and the organic light emitting layer to cover a portion of the first electrode, a second electrode disposed over the organic light emitting layer, and an encapsulating layer disposed over the second electrode. In embodiments, the first electrode includes a first portion and a second portion when viewed in a direction perpendicular to a major surface of the array substrate. The third electrode overlaps the first portion of the first electrode when viewed in the direction. The third electrode does not overlap the second portion of the first electrode when viewed in the direction.

Each of the first, second, and third light emitting devices includes a first electrode disposed over the array substrate, an organic light emitting layer disposed over the first electrode, and a second electrode disposed over the organic light emitting layer, wherein the third light emitting device further includes a third electrode disposed between the first electrode and the organic light emitting layer.

Embodiments of the inventive concept provide an organic light emitting display including a plurality of light emitting devices and first and second color filters having different colors from each other. The plurality of light emitting devices includes a plurality of first light emitting devices configured to emit light having a first color and a second light emitting device configured to emit light having a second color different from the first color, wherein each of the first and second color filters is disposed over one of the first light emitting devices.

The first color is magenta, the second color is green, the first color filter is a red color filter, and the second color filter is a blue color filter.

According to the above, the organic light emitting display may provide the full-color image even though the color filter is partially omitted.

In addition, the organic light emitting display includes the light emitting device that emits the white light, and thus the brightness of the organic light emitting display may be improved.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION

Figure 1:
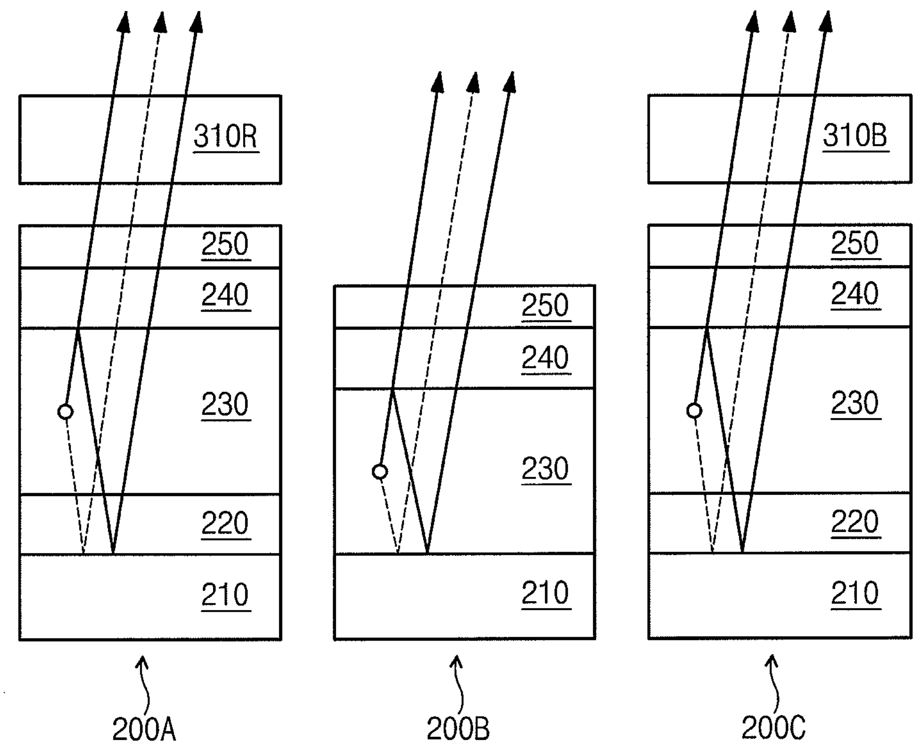
FIG. 1 is a concept cross-sectional view showing an organic light emitting display according to an exemplary embodiment of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

FIG. 1 is a concept cross-sectional view showing an organic light emitting display according to an exemplary embodiment of the present invention.

Referring to FIG. 1, an organic light emitting display includes a plurality of light emitting devices and a plurality of color filters 310R and 310B.

The plurality of light emitting devices includes a first light emitting device 200A and a second light emitting device 200C each emitting light having a first color and a third light emitting device 200B emitting light having a second color different from the first color. As an example, the first and second light emitting devices 200A and 200C emit a magenta light and the third light emitting device 200B emits a green light. In embodiments, the first color is a complementary color of the second color.

Each of the first light emitting device 200A, the second light emitting device 200C, and the third light emitting device 200B includes a first electrode 210, a second electrode 240 opposing the first electrode 210, an organic light emitting layer 230 interposed between the first electrode 210 and the second electrode 240, and an encapsulating layer 250 disposed on the second electrode 240.

In addition, the first light emitting device 200A and the second light emitting device 200C further include a third electrode 220 interposed between the first electrode 210 and the organic light emitting layer 230.

One of the first electrode 210 and the second electrode 240 is an anode electrode that provides holes injected into the organic light emitting layer 230 and the other is a cathode electrode that provides electrons injected into the organic light emitting layer 230. For example, the first electrode 210 serves as the anode electrode and the second electrode 240 serves as the cathode electrode.

Also, one of the first electrode 210 and the second electrode 240 is a transmissive electrode and the other is a reflective electrode.

In detail, in a case that the organic light emitting display is a front surface light emitting type, the first electrode 210 serves as the reflective electrode and the second electrode 240 serves as the transmissive electrode. In this case, the first electrode 210 has a multi-layer structure of a reflective conductor layer that reflects the light emitted from the organic light emitting layer 230 and a transmissive conductor layer that includes a transparent conductive oxide material of which work function is higher than that of the second electrode 240 in order to provide the holes to the organic light emitting layer 230. As an example, the first electrode 210 may have a structure of one of ITO/Ag/ITO, ITO/Ag/IZO, ATD (ITO/Ag alloy/ITO), and ITO/APC (Ag—Pd—Cu alloy)/ITO.

The second electrode 240 transmits the light emitted from the organic light emitting layer 230 and the light reflected from the first electrode 210. For instance, the second electrode 240 includes at least one of Ag, Mg, Al, Pt, Pd, Au, Ni, Nd, Ir, Cr, Li, Ca, which have a lower work function, and their alloys, and the second electrode 240 includes a metal thin film formed with a thickness through which a light passes on the organic light emitting layer 230. In addition, the second electrode 240 may further include a transparent conductive layer including a transparent conductive oxide material on the metal thin film to prevent a voltage drop (IR-drop) of the metal thin film.

Meanwhile, in a case that the organic light emitting display is a rear surface light emitting type, the first electrode 210 serves as the transmissive electrode and the second electrode 240 serves as the reflective electrode.

A light emitting layer of the organic light emitting layer 230 emits a white light. As an example, the light emitting layer has a structure in that a red light emitting layer, a green light emitting layer, and a blue light emitting layer are stacked one on another. In addition, the light emitting layer may be a single light emitting layer doped with red, green, and blue coloring materials on an organic material.

The third electrode 220 includes a transparent conductive oxide material that transmits the light and has a higher work function than that of the metal thin film of the second electrode 240. As an example, the third electrode 220 includes one of Indium Tin Oxide (ITO), Indium Zinc Oxide (IZO), Aluminum Zinc Oxide (AZO), Gallium-doped Zinc Oxide (GZO), Zinc Tin Oxide (ZTO), Gallium Tin Oxide (GTO), and Fluorine-doped Tin Oxide (FTO). In addition, the third electrode 220 controls a distance between the first electrode 210 and the second electrode 240 so that the magenta light, which is obtained by mixing the red light and the blue light, is emitted from the first light emitting device 200A and the second light emitting device 200C.

The encapsulating layer 250 is disposed on the second electrode 240 to isolate the first, second, and third light emitting devices 200A, 200C, and 200B from external environment. The encapsulating layer 250 includes a high-refractive index layer and a low-refractive index layer to allow the light emitted from the organic light emitting layer 230 to be effectively emitted from the first, second, and third light emitting devices 200A, 200C, and 200B.

Meanwhile, the distance between the first electrode 210 and the second electrode 240 in each of the first, second, and third light emitting devices 200A, 200C, and 200B is a resonance distance in which the light emitted from the organic light emitting layer 230 is resonated. The resonance distance of the first light emitting device 200A and the second light emitting device 200C is different from the resonance distance of the third light emitting device 200B.

When defining a phase shift, which is generated when the light emitted from the organic light emitting layer 230 is reflected by the first electrode 210 and the second electrode 240, as Ψ, the resonance distance as L, and a wavelength of the light, which is emitted from each of the first, second, and third light emitting devices 200A, 200C, and 200B among the light emitted from the organic light emitting layer 230, as λ, the resonance distance L satisfies the following equation 1.

$$(2L)/\lambda+\psi/(2\pi)=m_{(m\ \text{is an integer number})} \quad \text{[Equation 1]}$$

That is, the resonance distance of the first light emitting device 200A and the second light emitting device 200C is determined so that the first light emitting device 200A and the second light emitting device 200C emit the magenta light that is obtained by mixing the red light and the blue light to an exterior. In other words, the resonance distance of the first light emitting device 200A and the second light emitting device 200C is a distance in which both of the red light and the blue light are resonated.

In addition, the resonance distance of the third light emitting device 200B is determined to allow the green light to be emitted from the third light emitting device 200B to the exterior.

Since the first and second light emitting devices 200A and 200C further include the third electrode 220, the resonance distance of the first and second light emitting devices 200A and 200C is greater than the resonance distance of the third light emitting device 200B.

The color filters 310R and 310B have different colors from each other. For example, a first color filter 310R corresponding to the first light emitting device 200A has a red color and a second color filter 310B corresponding to the second light emitting device 200C has a blue color. The first light emitting device 200A emits the magenta light, and thus the light passing through the first color filter 310R is the red light. In addition, since the second light emitting device 200C emits the magenta light either, the light that passes through the second color filter 310B is the blue light.

In addition, the third light emitting device 200B emits the green light, and thus the third light emitting device 200B does not require a green color filter.

Therefore, the organic light emitting display may provide a full-color image to a viewer using the light emitted from the first, second, and third light emitting devices 200A, 200C, and 200B without employing the color filter corresponding to the third light emitting device 200B.

Figure 2:
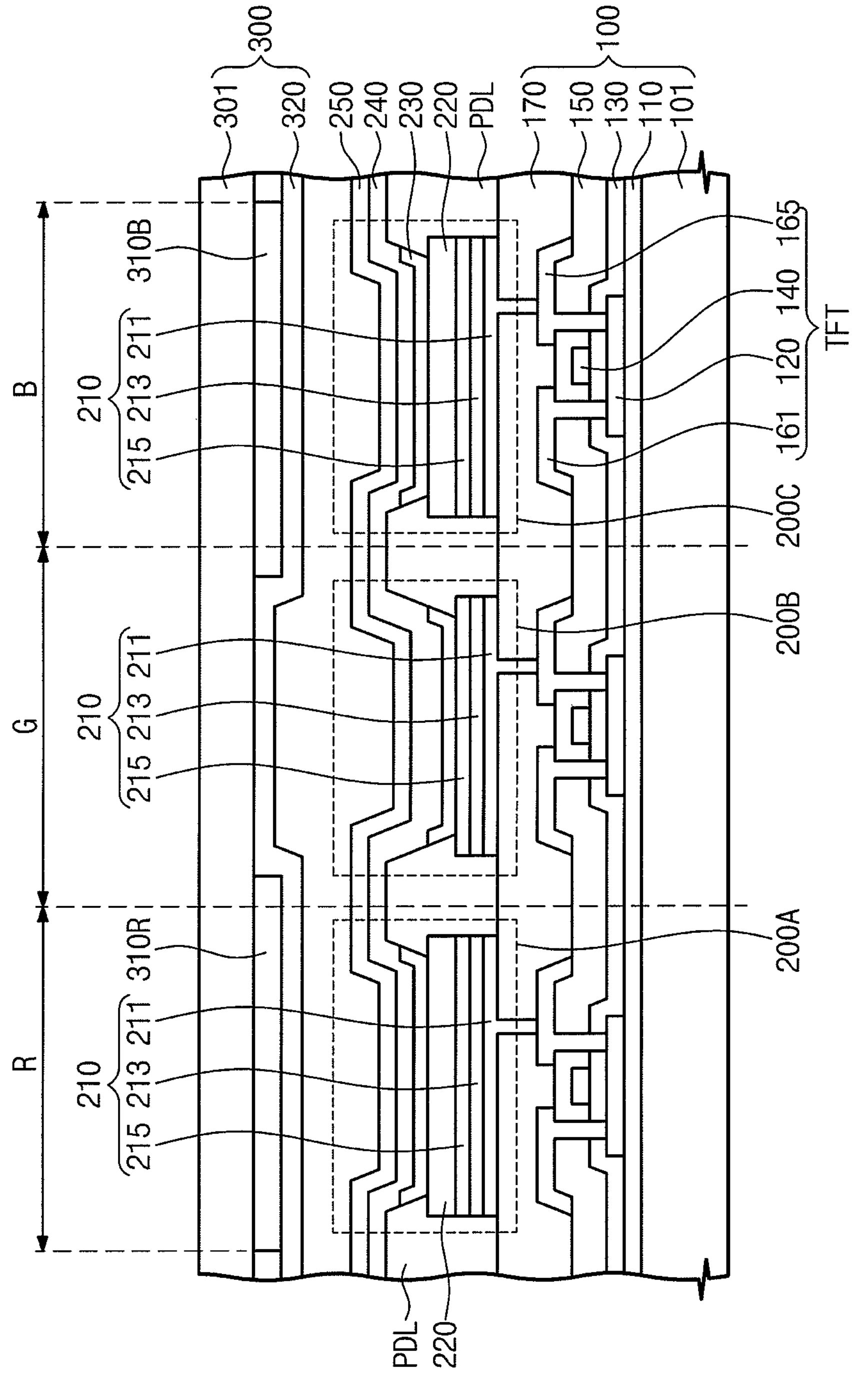
FIG. 2 is a cross-sectional view showing the organic light emitting display shown in FIG. 1.

FIG. 2 is a cross-sectional view showing the organic light emitting display of FIG. 1.

Referring to FIG. 2, the organic light emitting display includes a plurality of pixel areas R, G, and B realizing different colors from each other. The organic light emitting display includes a red pixel area R, a green pixel area G, and a blue pixel area B. Also, the organic light emitting display includes an array substrate 100, the first light emitting device 200A, a second light emitting device 200C a third light emitting device 200B, and a covering substrate 300 opposing the array substrate 100.

The array substrate 100 includes a base substrate 101, thin film transistors TFT disposed on the base substrate 101 to respectively correspond to the red pixel area R, the green pixel area G, and the blue pixel area B, and a protective layer 170 covering the thin film transistors TFT. In addition, the array substrate 100 may further include a buffer layer 110 interposed between the base substrate 101 and the thin film transistors TFT.

The base substrate 101 includes a transparent insulating material. The base substrate 101 is an insulating substrate of a rigid type substrate formed of a polymer, such as glass or transparent plastic. In the case that the base substrate 101 is the plastic substrate, the base substrate 101 includes polyethylene terephthalate (PET), fiber reinforced plastic, or polyethylene naphthalate (PEN). The base substrate 101 may be a transparent flexible type insulating substrate.

The buffer layer 110 has a single-layer structure of a silicon oxide layer or a silicon nitride layer, or a multi-layer structure of the silicon oxide layer and the silicon nitride layer. The buffer layer 110 prevents impurities from being diffused to the thin film transistors TFT and prevents moisture and oxygen from infiltrating into the thin film transistors TFT. Also, the buffer layer 110 planarizes a surface of the base substrate 101.

Each thin film transistor TFT includes a semiconductor layer 120 disposed on the buffer layer 110, a gate electrode 140 insulated from the semiconductor layer 120 and disposed on the semiconductor layer 120, and a source electrode 161 and a drain electrode 165 that make contact with the semiconductor layer 120.

The semiconductor layer 120 is formed of an amorphous silicon a-Si or polycrystalline silicon p-Si. Portions of the semiconductor layer 120 that make respectively contact with the source electrode 161 and the drain electrode 165 are source and drain areas, which are doped with the impurities, and an area between the source area and the drain area serves as a channel area.

A gate insulating layer 130 is disposed between the semiconductor layer 120 and the gate electrode 140 to insulate the semiconductor layer 120 from the gate electrode 140. The gate insulating layer 130 includes silicon oxide ($SiO_2$) and/or silicon nitride (SiNx).

The gate electrode 140 is disposed on the gate insulating layer 130 and connected to a gate line (not shown) to receive a gate signal. The gate electrode 140 is overlapped with the channel area of the semiconductor layer 120. The gate electrode 140 includes at least one of Mo, W, MoW, Cr, Cu, Cu alloy, Ag, Ag alloy, Al, and Al alloy.

An inter-insulating layer 150 is disposed on the gate insulating layer 130 and the gate electrode 140. Similar to the gate insulating layer 130, the inter-insulating layer 150 includes silicon oxide or silicon nitride. Also, the inter-insulating layer 150 includes a contact hole formed therethrough to partially expose the source area and the drain area of the semiconductor layer 120.

The source electrode 161 and the drain electrode 165 respectively make contact with the source area and the drain area through the contact hole. The source electrode 161 and the drain electrode 165 includes at least one of Mo, W, MoW, Cr, Cu, Cu alloy, Ag, Ag alloy, Al, and Al alloy.

The source electrode 161 is connected to a data line (not shown) to receive a data signal. The drain electrode 165 is connected to one of the first, second, and third light emitting devices 200A, 200C, and 200B.

The protective layer 170 covers the thin film transistors TFT to isolate the thin film transistors TFT from the external environment. Thus, the protective layer 170 prevents impurities from being diffused to the thin film transistors TFT and prevents moisture and oxygen from infiltrating into the thin film transistors TFT. The protective layer 170 includes at least one of an inorganic insulating layer and an organic insulating layer, and the protective layer 170 planarizes the surface of the array substrate 100. The protective layer 170 includes a via hole formed therethrough to expose a portion of the drain electrode 165.

The first, second, and third light emitting devices 200A, 200C, and 200B are disposed on the array substrate 100 to correspond to the red pixel area R, the green pixel area G, and the blue pixel area B, respectively. In detail, the first light emitting device 200A is disposed in the red pixel area R, the second light emitting device 200C is disposed in the blue pixel area B, and the third light emitting device 200B is disposed in the green pixel area G.

Each of the first, second, and third light emitting devices 200A, 200C, and 200B includes the first electrode 210 disposed on the protective layer 170 and connected to the drain electrode 165 of the thin film transistors TFT through the via hole, the second electrode 240 opposing the first electrode 210, the organic light emitting layer 230 interposed between the first electrode 210 and the second electrode 240, and the encapsulating layer 250 disposed on the second electrode 240. In addition, each of the first and second light emitting devices 200A and 200C further includes the third electrode 220 interposed between the first electrode 210 and the organic light emitting layer 230.

One of the first electrode 210 and the second electrode 240 is the anode electrode that provides holes injected into the organic light emitting layer 230 and the other is the cathode electrode that provides electrons injected into the organic light emitting layer 230. For example, the first electrode 210 serves as the anode electrode and the second electrode 240 serves as the cathode electrode.

The first electrode 210 is the reflective electrode and includes a first conductive layer 211, a second conductive layer 213, and a third conductive layer 215. The first conductive layer 211 is connected to the drain electrode 165 and includes one of ITO, IZO, AZO, GZO, ZTO, GTO, and FTO. The second conductive layer 213 is disposed on the first conductive layer 211 and includes at least one of Mo, MoW, Cr, APC (Ag—Pd—Cu alloy), Al, and Al alloy so as to reflect the light. The third conductive layer 215 is disposed on the second conductive layer 213 and includes the same material as the first conductive layer 211.

The second electrode 240 is disposed on the organic light emitting layer 230 and transmits the light emitted from the organic light emitting layer 230 and the light reflected by the first electrode 210. As an example, the second electrode 240 includes at least one of Ag, Mg, Al, Pt, Pd, Au, Ni, Nd, Ir, Cr, Li, Ca, and their alloys, which have the lower work function, and the second electrode 240 is a metal thin film formed with the thickness through which the light passes. In addition, the second electrode 240 further includes a transparent conductive layer including the transparent conductive oxide material on the metal thin film so as to prevent the voltage drop (IR-drop) of the metal thin film.

The organic light emitting layer 230 includes at least an emitting layer EML and has a multi-layer thin film structure. The organic light emitting layer 230 includes a hole injection layer HIL injecting the holes, a hole transport layer HTL controlling movement of the electrons, which are not combined with the holes in the emitting layer EML, to enhance a chance of recombination between the holes and the electrons, the emitting layer EML emitting the light according to the recombination between the injected holes and electrons, a hole blocking layer HBL controlling movement of the holes that are not combined with the electrons in the emitting layer EML, an electron transport layer ETL efficiently transporting electrons to the emitting layer EML, and an electron injection layer EIL injecting electrons.

The emitting layer EML of the organic light emitting layer 230 emits the white light. As an example, the light emitting layer EML has a structure in that the red light emitting layer, the green light emitting layer, and the blue light emitting layer are stacked. Also, the light emitting layer EML may be a single light emitting layer doped with the red, green, and blue coloring materials on the organic material.

The third electrode 220 includes the same material as the first conductive layer 211 of the first electrode 210. Thus, the third electrode 220 transmits the light emitted from the organic light emitting layer 230. Also, the third electrode 220 controls the distance between the first electrode 210 and the second electrode 240 to allow the magenta light, which is obtained by mixing the red light and the blue light, to be emitted from the first light emitting device 200A and the second light emitting device 200C.

The encapsulating layer 250 is disposed on the second electrode 240 to isolate the first, second, and third light emitting devices 200A, 200C, and 200B from the external environment. In addition, the encapsulating layer 250 includes the high-refractive index layer and the low-refractive index layer so as to allow the light emitted from the organic light emitting layer 230 to be efficiently emitted from the first, second, and third light emitting devices 200A, 200C, and 200B.

The high-refractive index layer includes an organic material or an inorganic material having a refractive index of about 1.7 to about 2.7. The inorganic material is at least one of zinc oxide, titanium oxide, zirconium oxide, silicon nitride, niobium oxide, tantalum oxide, tin oxide, nickel oxide, indium nitride, and gallium nitride. Also, the organic material is at least one of acrylic, polyimide, and polyamide.

The low-refractive index layer includes the inorganic material or the organic material. The inorganic material is at least one of silicon oxide and magnesium fluoride. The organic material is at least one of acrylic, polyimide, polyamide, and Alq3 (Tris(8-hydroxyquinolinato)aluminum).

The covering substrate 300 includes a transparent insulating substrate 301, the color filters 310R and 310B disposed on the insulating substrate 301 while opposing the array substrate 100, and an overcoat layer 320 covering the color filters 310R and 310B.

The insulating substrate 301 includes a transparent insulating material similar to the base substrate 101.

The color filters 310R and 310B have different colors from each other. In detail, the first color filter 310R corresponding to the first light emitting device 200A has a red color, the second color filter 310B corresponding to the second light emitting device 200C has a blue color. The first color filter 310R is disposed in the red pixel area R and the second color filter 310B is disposed in the blue pixel area B. No color filter is disposed in the green pixel area G.

Figure 3A:
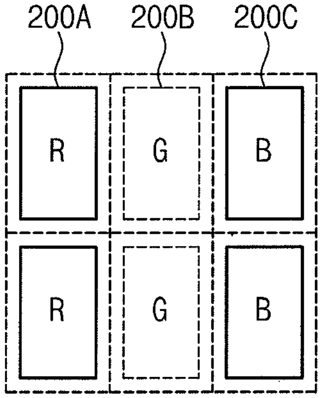
FIGS. 3A to 3C are plan views showing a pixel area of the organic light emitting display shown in FIG. 1.
Figure 3B:
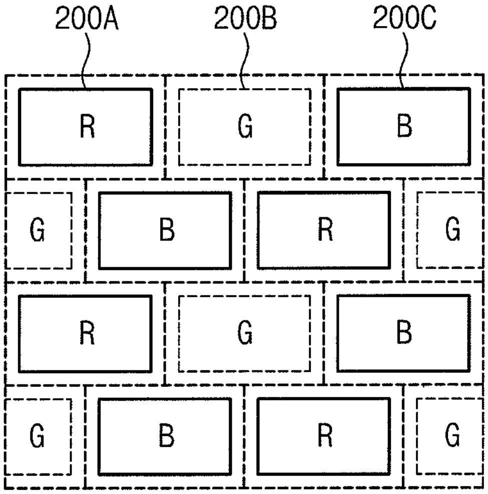
Figure 3C:
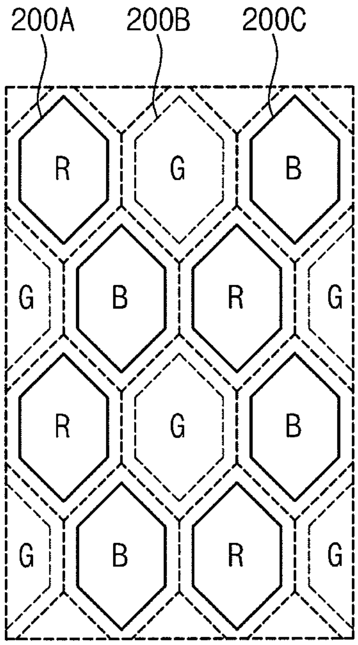

FIGS. 3A to 3C are plan views showing pixel areas of the organic light emitting display of FIG. 2.

Referring to FIGS. 3A to 3C, the first light emitting device 200A, the third light emitting device 200B, and the second light emitting device 200C are arranged corresponding to the pixel areas R, G, and B, respectively. In detail, the first light emitting device 200A is disposed in the red pixel area R, the second light emitting device 200C is disposed in the blue pixel area B, and the third light emitting device 200B is disposed in the green pixel area G.

Each of the pixel areas R, G, and B has a rectangular shape with a long side and a short side. As shown in FIG. 3A, each of the pixel areas R, G, and B has the rectangular shape of which long side is substantially in parallel with a vertical direction. The red pixel area R, the green pixel area G, and the blue pixel area B are sequentially arranged in a horizontal direction, and pixel areas having the same color are arranged in the vertical direction. In addition, according to another exemplary embodiment shown in FIG. 3B, each of the pixel areas R, G, and B may have a rectangular shape of which long side is substantially in parallel with the horizontal direction. Therefore, the red pixel area R, the green pixel area G, and the blue pixel area B are sequentially arranged in the horizontal direction and are randomly arranged in the vertical direction.

Also, each of the pixel areas R, G, and B may have a hexagonal shape as shown in FIG. 3C.

Figure 4:
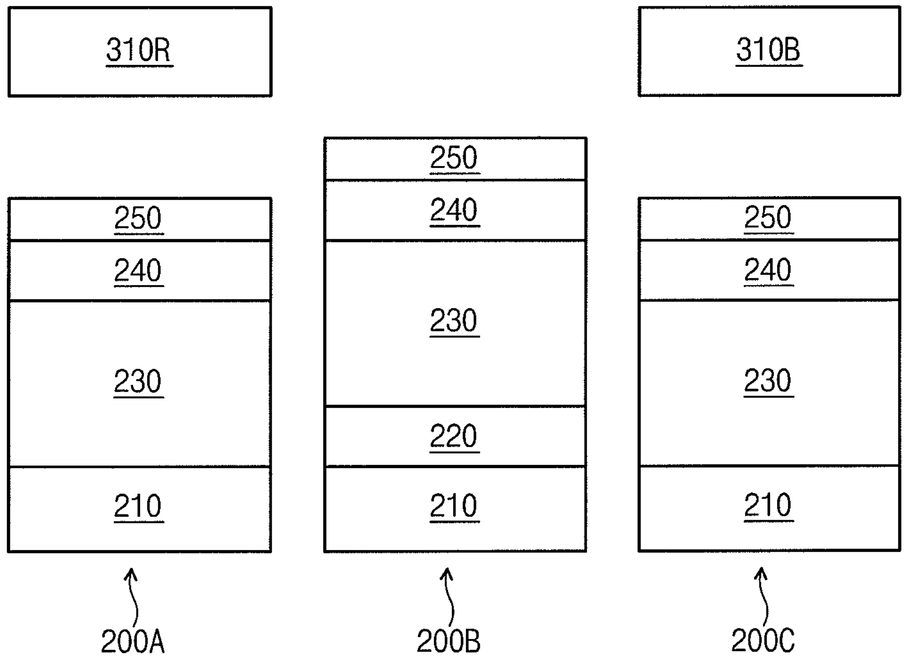
FIG. 4 is a cross-sectional view showing an organic light emitting display according to another exemplary embodiment of the present invention.
Figure 5:
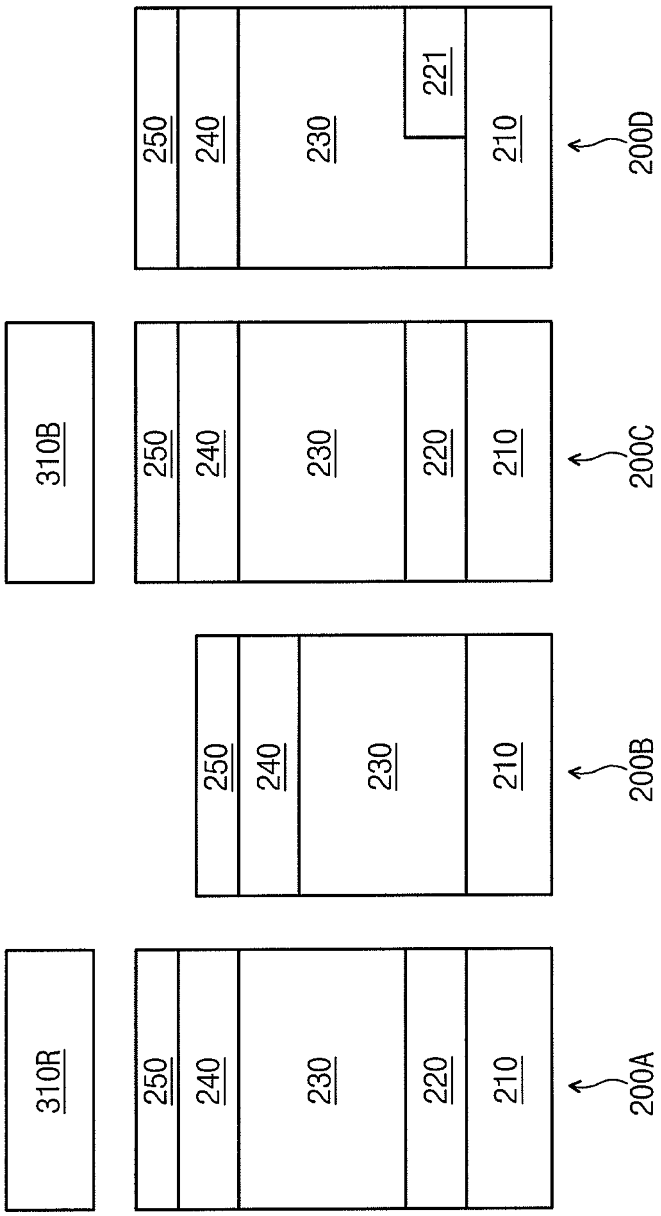
FIG. 5 is a cross-sectional view showing an organic light emitting display according to another exemplary embodiment of the present invention.
Figure 6:
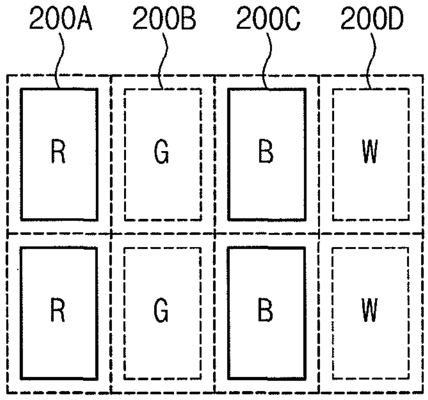
FIG. 6 is a plan view showing a pixel area of the organic light emitting display shown in FIG. 5.

Hereinafter, an organic light emitting display according to another exemplary embodiment will be described. In FIGS. 4 to 6, the same reference numerals denote the same elements in FIGS. 1, 2, and 3A to 3C, and thus the detailed descriptions of the same elements will be omitted in order to avoid redundancy.

FIG. 4 is a cross-sectional view showing an organic light emitting display according to another exemplary embodiment of the present invention.

Referring to FIG. 4, an organic light emitting display includes a plurality of light emitting devices and a plurality of color filters 310R and 310B.

The plurality of light emitting device includes a first light emitting device 200A and a second light emitting device 200C, which emit light having a first color, and a third light emitting device 200B that emits light having a second color different from the first color. The first light emitting device 200A and the second light emitting device 200C emit a magenta light, and the third light emitting device 200B emits a green light. That is, the first color is a complementary color to the second color.

Each of the first light emitting device 200A, the second light emitting device 200C, and the third light emitting device 200B includes a first electrode 210, a second electrode 240 opposing the first electrode 210, an organic light emitting layer 230 interposed between the first electrode 210 and the second electrode 240, and an encapsulating layer 250 disposed on the second electrode 240.

In addition, the third light emitting device 200B further includes a third electrode 220 interposed between the first electrode 210 and the organic light emitting layer 230.

The third electrode 220 includes a transparent conductive oxide material that transmits the light. Therefore, the third electrode 220 controls a resonance distance between the first electrode 210 and the second electrode 240 so that a green light is emitted from the third light emitting device 200B.

Meanwhile, the resonance distance of the first light emitting device 200A and the second light emitting device 200C is different from the resonance distance of the third light emitting device 200B.

That is, the resonance distance of the first light emitting device 200A and the second light emitting device 200C is determined to allow the magenta light, which is obtained by mixing a red light and a blue light, to be emitted from the first light emitting device 200A and the second light emitting device 200C. Also, the resonance distance of the third light emitting device 200B is determined to allow the green light to be emitted from the third light emitting device 200B.

Since the third light emitting device 200B further includes the third electrode 220, the resonance distance of the third light emitting device 200B is greater than the resonance distance of the first light emitting device 200A and the second light emitting device 200C.

The color filters 310R and 310B have different colors from each other. The first color filter 310R corresponding to the first light emitting device 200A has the red color, and the second color filter 310B corresponding to the second light emitting device 200C has the blue color. Since the first light emitting device 200A emits the magenta light, the light that transmits the first color filter 310R is the red light. Also, the second light emitting device 200C emits the magenta light, and thus the light that transmits the second color filter 310B is the blue light.

Since the third light emitting device 200B emits the green light, a green color filter is not required on the third light emitting device 200B.

Therefore, the organic light emitting display may provide the full-color image to the viewer using the light emitted from the first, second, and third light emitting devices 200A, 200C, and 200B without employing a color filter corresponding to the third light emitting device 200B.

FIG. 5 is a cross-sectional view showing an organic light emitting display according to another exemplary embodiment of the present invention.

Referring to FIG. 5, an organic light emitting display includes a plurality of light emitting devices and a plurality of color filters 310R and 310B.

The plurality of light emitting devices includes a first light emitting device 200A and a second light emitting device 200C, which emit light having a first color, a third light emitting device 200B that emits light having a second color different from the first color, and a fourth-sub light emitting device 200D that emits light having a third color different from the first and second colors. The first and second light emitting devices 200A and 200C emit a magenta light, the third light emitting device 200B emits a green light, and the fourth light emitting device 200D emits a white light. The first color is in a complementary relation to the second color.

Each of the first to fourth light emitting devices 200A, 200C, 200B, and 200D includes a first electrode 210, a second electrode 240 opposing the first electrode 210, an organic light emitting layer 230 interposed between the first electrode 210 and the second electrode 240, and an encapsulating layer 250 disposed on the second electrode 240.

The first light emitting device 200A and the second light emitting device 200C further include a third electrode 220 interposed between the first electrode 210 and the organic light emitting layer 230. The third electrode 220 includes a transparent conductive oxide material that transmits a light. Thus, the third electrode 220 controls a resonance distance between the first electrode 210 and the second electrode 240 so that the magenta light is emitted from the first light emitting device 200A and the second light emitting device 200C.

The fourth light emitting device 200D further includes a fourth electrode 221 that partially covers the first electrode 210.

The fourth electrode 221 includes the transparent conductive oxide material that transmits a light. Since the fourth electrode 221 controls a resonance distance between the first electrode 210 and the second electrode 240, the fourth light emitting device 200D emits the magenta light in the area where the fourth electrode 221 is disposed and emits the green light in the area where the fourth electrode 221 is not disposed. Therefore, the fourth light emitting device 200D emits the white light, which is obtained by mixing the magenta light and the green light.

The color filters 310R and 310B have different colors from each other. A first color filter 310R corresponding to the first light emitting device 200A has a red color and a second color filter 310B corresponding to the second light emitting device 200C has a blue color. Since the first light emitting device 200A emits the magenta light, the light that transmits through the first color filter 310R is the red color. In addition, since the second light emitting device 200C emits the magenta light, the light that transmits through the second color filter 310B is the blue color.

The third light emitting device 200B emits the green light, and thus the third light emitting device 200B does not require a green color filter on the third light emitting device 200B.

The fourth light emitting device 200D emits the white light, and the fourth light emitting device 200D does not require a color filter.

Consequently, the organic light emitting display may provide the full-color image to the viewer using the light emitted from the first to third light emitting devices 200A, 200C, and 200B without employing the color filter corresponding to the third light emitting device 200B.

Also, the organic light emitting display includes the fourth light emitting device 200D emitting the white light, and thus brightness of the image provided to the viewer may be enhanced.

FIG. 6 is a plan view showing the pixel areas in the organic light emitting display shown in FIG. 5.

Referring to FIG. 6, the organic light emitting display includes a plurality of pixel areas R, G, B, and W each displaying different colors. The organic light emitting display includes a red pixel area R, a green pixel area G, a blue pixel area B, and a white pixel area W.

Each of the pixel areas R, G, B, and W has a rectangular shape with a long side and a short side, and the long side of each pixel area R, G, B, and W is substantially in parallel with a vertical direction. The red pixel area R, the green pixel area G, the blue pixel area B, and the white pixel area W are sequentially arranged in a horizontal direction, and the pixel areas having the same color are arranged in the vertical direction.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An organic light emitting display comprising:

a substrate;

an array of a plurality of light emitting devices disposed over the substrate; and a plurality of color filters disposed over the array, wherein the plurality of light emitting devices comprises a first light emitting device, a second light emitting device and a third light emitting device, each of the first, second and third light emitting devices comprising a first electrode, a second electrode and an organic light emitting layer interposed between the first and second electrodes such that light beams generated by the organic light emitting layer are selected by reflective resonance between the first and second electrodes to emit selected light beams, wherein each of the first and second light emitting devices has a first distance between the first and second electrodes thereof to select first light beams having a secondary color, whereas the third light emitting device has a second distance between the first and second electrodes thereof to select second light beams having a first primary color different from the first secondary color, wherein the plurality of color filters comprises first and second color filters aligned over the first light emitting device and the second light emitting device, respectively, wherein the first color filter is configured to transmit third light beams having a second primary color, wherein the second color filter is configured to transmit fourth light beams having a third primary color, wherein the first to third primary colors are different colors selected from red, green and blue wherein the secondary color consist of the second and third primary colors.

2. The organic light emitting display of claim 1, wherein the first primary color is in a complementary relation to the secondary color.

3. The organic light emitting display of claim 1, wherein each of the first and second light emitting devices further comprises a third electrode interposed between the first electrode and the organic light emitting layer thereof, the third electrode comprising a transparent conductive layer.

4. The organic light emitting display of claim 3, wherein the first electrode comprises:

first and second conductive layers comprising a transparent conductive oxide material; and a third conductive layer disposed between the first conductive layer and the second conductive layer and comprising a reflective material.

5. The organic light emitting display of claim 4, wherein the third conductive layer comprises at least one selected from the group consisting of Mo, MoW, Cr, APC (Ag—Pd—Cu alloy), Al, and Al alloy.

6. The organic light emitting display of claim 3, wherein the third electrode comprises a transparent conductive oxide material.

7. The organic light emitting display of claim 3, further comprising an encapsulating layer disposed over the second electrode.

* * * * *